United States Patent
Brolin

(10) Patent No.: US 8,018,732 B2
(45) Date of Patent: Sep. 13, 2011

(54) PROTECTED AND UNPROTECTED INTERFACES VIA I/O PANEL CHOICE

(75) Inventor: Stephen J. Brolin, Livingston, NJ (US)

(73) Assignee: Fujitsu Limited, Kawasaki (JP)

( * ) Notice: Subject to any disclaimer, the term of this patent is extended or adjusted under 35 U.S.C. 154(b) by 385 days.

(21) Appl. No.: 12/390,833

(22) Filed: Feb. 23, 2009

(65) Prior Publication Data

US 2010/0216319 A1    Aug. 26, 2010

(51) Int. Cl.
*H05K 7/14*    (2006.01)
(52) U.S. Cl. ......................................................... 361/788
(58) Field of Classification Search .................. 361/788, 361/796, 827, 785, 789, 822–823; 439/76.1, 439/79
See application file for complete search history.

(56) References Cited

U.S. PATENT DOCUMENTS

| | | | |
|---|---|---|---|
| 2003/0033459 A1* | 2/2003 | Garnett | 710/100 |
| 2003/0142484 A1* | 7/2003 | Hanson et al. | 361/796 |
| 2003/0147375 A1* | 8/2003 | Goergen et al. | 370/351 |
| 2003/0179741 A1* | 9/2003 | Goergen | 370/351 |
| 2004/0102084 A1* | 5/2004 | Bozso et al. | 439/501 |
| 2005/0025044 A1* | 2/2005 | Pitio | 370/220 |

\* cited by examiner

*Primary Examiner* — Jean F Duverne
(74) *Attorney, Agent, or Firm* — Baker Botts L.L.P.

(57) ABSTRACT

A system comprises a backplane configured to receive a first signal and a second signal from a first plug-in unit, and a third signal and a fourth signal from a second plug-in unit, wherein the backplane is further configured to communicate each of the signals to one or more mid-plane connectors. The system further comprises the one or more mid-plane connectors configured to output the first and third signals at a first output as separate signals, and configured to output the second and fourth signals at a second output as separate signals. The system further comprises one or more I/O panels each configured to receive the first and third signals at a first input and to receive the second and fourth signals at a second input.

14 Claims, 5 Drawing Sheets

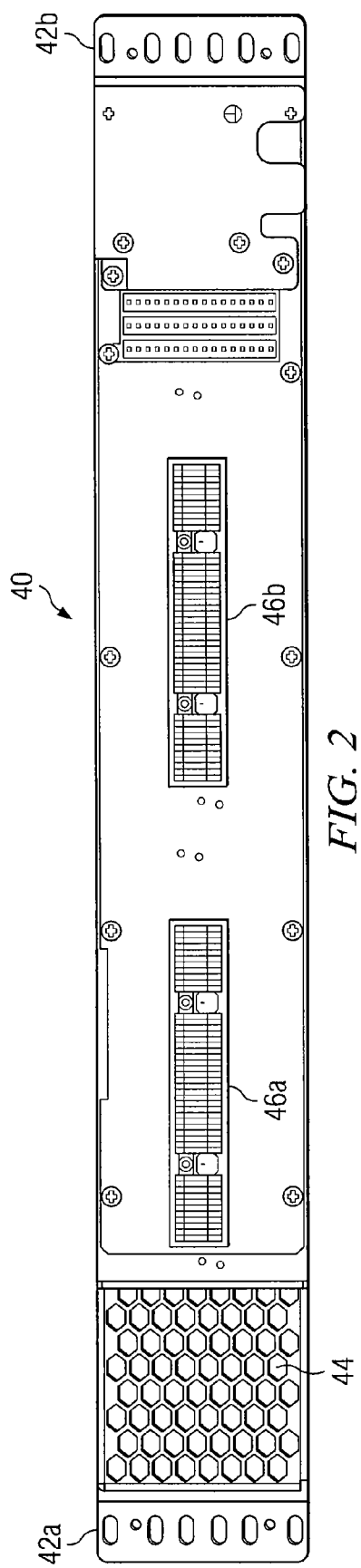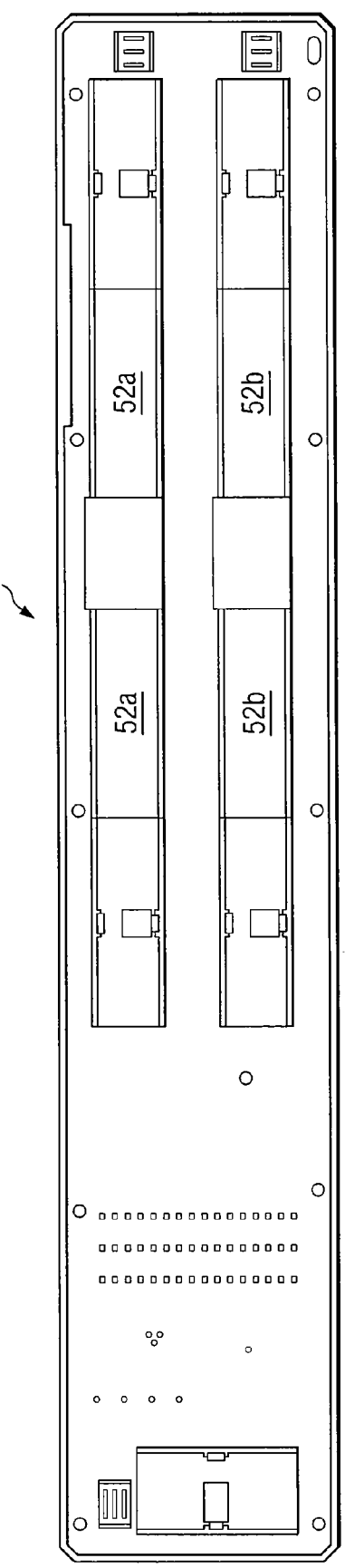
FIG. 2
FIG. 3

PROTECTED AND UNPROTECTED INTERFACES VIA I/O PANEL CHOICE

TECHNICAL FIELD

This disclosure relates in general to modular electronic systems and more particularly to a method and system for providing protected and/or unprotected interfaces via an I/O panel.

OVERVIEW

In some electronic systems, plug-in units may be used to provide a variety of applications and functionality. Plug-in units may be situated in a shelf and coupled to a backplane. Backplane space may be limited, and in some instances it may be difficult to fit all the desired functionality on the backplane. In some existing systems, signals from the plug-in units may be tied together on the backplane to create a protected interface. Tying the signals together on the backplane may cause bridge taps for certain signals. Tying the signals together on the backplane may also waste the capacity of the plug-in units if an unprotected interface is desired.

SUMMARY OF EXAMPLE EMBODIMENTS

In accordance with one embodiment of the present disclosure, a system comprises a backplane configured to receive a first signal and a second signal from a first plug-in unit, and a third signal and a fourth signal from a second plug-in unit, wherein the backplane is further configured to communicate each of the signals to one or more mid-plane connectors. The system further comprises the one or more mid-plane connectors configured to output the first and third signals at a first output as separate signals, and configured to output the second and fourth signals at a second output as separate signals. The system further comprises one or more I/O panels each configured to receive the first and third signals at a first input and to receive the second and fourth signals at a second input.

In accordance with another embodiment of the present disclosure, a method comprises transmitting a first signal and a second signal from a first plug-in unit through a backplane to one or more mid-plane connectors, and transmitting a third signal and a fourth signal from a second plug-in unit through the backplane to one or more mid-plane connectors, wherein the signals are not tied together at the backplane. The method further comprises outputting the first signal and the third signal from a first mid-plane connector as separate signals, and outputting the second signal and the fourth signal from a second mid-plane connector as separate signals. The method also comprises receiving the first and third signals at a first input of an I/O panel, and receiving the second and fourth signals at a second input of the I/O panel.

Numerous technical advantages are provided according to various embodiments of the present disclosure. Particular embodiments of the disclosure may exhibit none, some, or all of the following advantages depending on the implementation. In certain embodiments, a single backplane layout may be used that provides the option of either protected or unprotected interfaces for plug-in units. In addition, in some embodiments an I/O panel can be chosen to provide a desired physical media type. The choice of protected or unprotected interfaces may be determined by the I/O panel selection in some embodiments. In some embodiments, a backplane can be free of connectors, providing space on the backplane for other functionality.

Other technical advantages of the present disclosure will be readily apparent to one skilled in the art from the following figures, descriptions, and claims. Moreover, while specific advantages have been enumerated above, various embodiments may include all, some, or none of the enumerated advantages.

BRIEF DESCRIPTION OF THE DRAWINGS

For a more complete understanding of the present disclosure and its advantages, reference is now made to the following description, taken in conjunction with the accompanying drawings, in which:

FIG. 2 illustrates one example embodiment of a mid-plane connector as viewed from the rear of a shelf without I/O panels installed;

FIG. 3 illustrates one example embodiment of a portion of a backplane assembly as viewed from the front of the shelf without plug-in units installed;

DETAILED DESCRIPTION

Modular communication systems may employ plug-in units ("PIUs") to provide a variety of functionality. PIUs may be allocated in pairs in certain embodiments, and may reside in a shelf coupled to a backplane. In certain embodiments of the present disclosure, a system comprising a backplane and a plurality of PIUs may also comprise one or more mid-plane connectors operable to couple to one or more PIUs, and one or more I/O panels operable to couple to one or more mid-plane connectors. The one or more I/O panels may provide for either protected or unprotected communication interfaces, and may also provide flexibility in physical media type.

Figure 1:
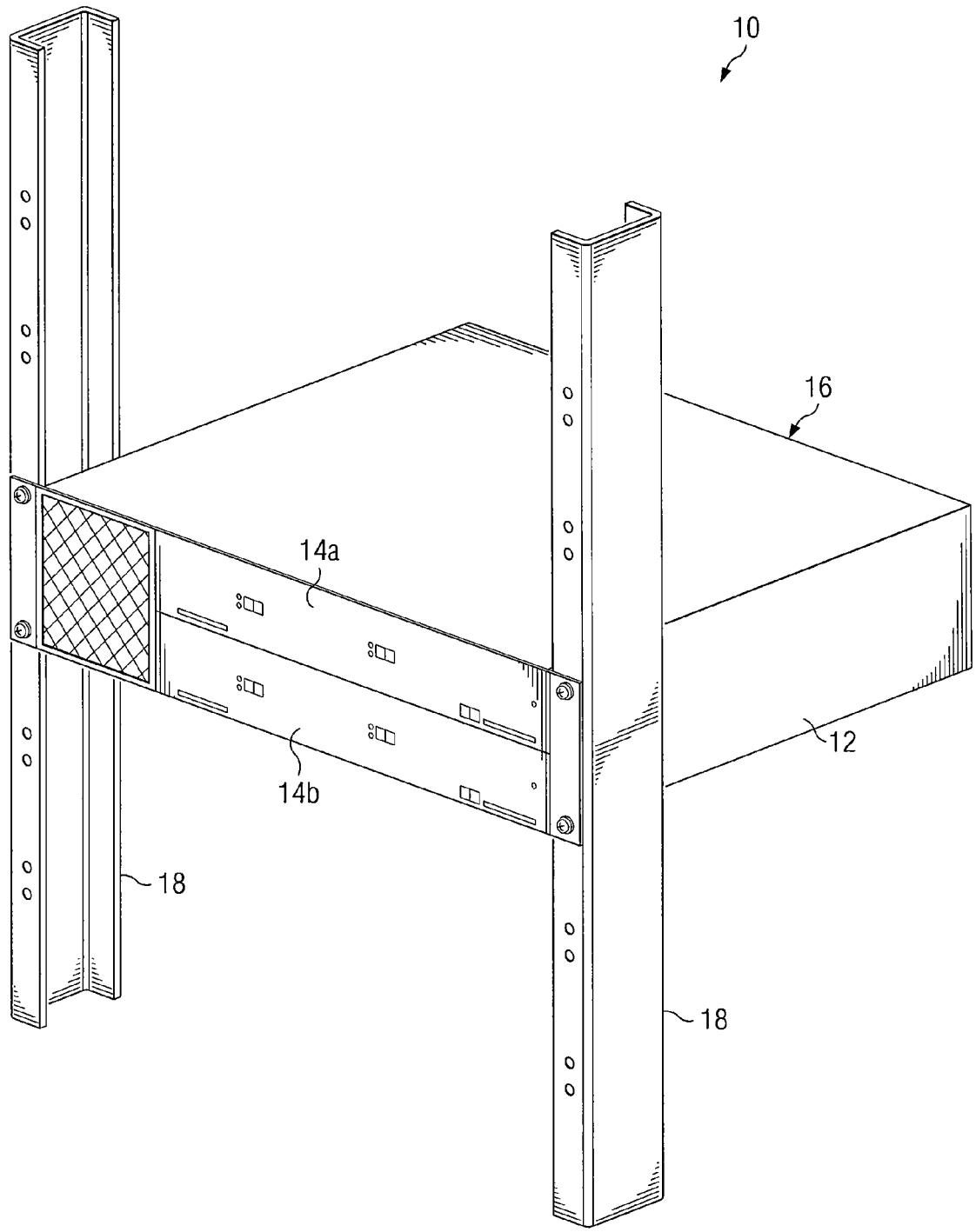
FIG. 1 illustrates a system operable to provide protected and/or unprotected interfaces via an I/O panel.

FIG. 1 illustrates a system 10 operable to provide protected and/or unprotected interfaces via an I/O panel. System 10 may further comprise, in some embodiments, a system that allows for a choice of connector types on the I/O panel. In one example embodiment, system 10 comprises a case 12, one or more plug-in units 14 (illustrated as plug-in units 14a and 14b in this embodiment), and rack structure 18. Although not visible in this figure, system 10 further comprises I/O panel 16.

System 10 may be used for a variety of applications. In some embodiments, system 10 may be a communications system. Plug-in units 14a and 14b may provide networking applications, such as telecommunications or data routing. Plug-in units 14a and 14b may comprise physical interfaces on the front side, the back side, or both to connect to other network components and send signals to and receive signals from such other network components. Other embodiments may comprise more than two plug-in units 14. In addition, in some systems, plug-in units 14 are allocated in pairs. Plug-in units 14 may comprise any suitable hardware and/or software operable to provide functionality for the system, including any memory, processor, or other components.

Plug-in units 14 couple to a backplane (not visible in FIG. 1) in case 12. The backplane may provide a variety of functions in system 10, such as providing electrical connectivity between components of system 10 and transmitting signals between these components. Plug-in units 14 may comprise any suitable connector to couple to the backplane. System 10 may also couple to any appropriate number of plug-in units 14 or other components of system 10. The backplane may further comprise one or more midplane connectors (MPCs) (not visible in FIG. 1). The MPCs may receive one or more signals from one or more plug-in units 14, and may also receive one or more signals from the backplane. The MPCs could comprise a part of the backplane in some embodiments, or could be a separate component in other embodiments. In certain embodiments, signals from one or more plug-in units 14 are coupled through the backplane to one or more MPCs. The MPCs may provide electrical connectivity to the backplane and/or to other components of system 10.

System 10 may further comprise one or more I/O panels 16. I/O panels 16 may provide a variety of functionality for system 10. I/O panels 16 may couple to one or more plug-in units 14 to send signals and/or receive signals from plug-in units 14. I/O panels 16 may communicate with plug-in units 14 through a backplane and/or an MPC. In some embodiments, I/O panels 16 may tie together signals from plug-in units 14 to provide a protected interface. In other embodiments, I/O panels 16 may transmit one or more signals without tying signals together to provide an unprotected interface. I/O panels 16 may also comprise a variety of connectors for transmitting one or more signals. For example, some I/O panels 16 may comprise one or more DS1 or DS3 connections. Other I/O panels 16 may comprise Ethernet connections, such as 10BASE-T, 100BASE-T, or 1000BASE-T. The type of I/O panel 16 may be selected by a user to provide the connections that the user needs for his or her applications. The user may also select an I/O panel 16 that provides a protected interface or one that provides an unprotected interface.

I/O panels 16 can provide this functionality when signals from the plug-in units 14 are not tied together on the backplane. If signals are tied together on the backplane, unprotected interfaces cannot be implemented with I/O panels 16. By not tying signals together on the backplane, the choice of I/O panel 16 can provide for either unprotected or protected interfaces. In addition, I/O panels 16 can provide a choice of connector type, such as DS3, Ethernet, or any other suitable connector type. An I/O panel 16 with the appropriate type of connector can be chosen for any particular application. In addition, this flexibility in connection type offered by the choice of I/O panel 16 allows the backplane to be free of any I/O (input-output) connectors, which can provide space on the backplane that can be used for other purposes. As another feature, a generic backplane may be used in some embodiments, and the choice of I/O panel 16 can determine the type of connector and whether the interface is protected or unprotected.

Another advantage of system 10 is that higher frequency signals can sometimes create bridge taps when tied together on the backplane, which can hinder performance for some unprotected high frequency signals. Signals from plug-in units 14 are not tied together on the backplane in system 10, so this problem may be mostly avoided. In some existing systems some signals may be tied together on a backplane to provide a protected interface when one is not desired. In those cases, capacity of the system is wasted by tying the signals together because the signal from only one of the plug-in units 14 can be used at any given time. In system 10, signals from plug-in units 14 can be kept separate when an unprotected interface is desired, allowing the capacity of the plug-in units to be more fully utilized.

Yet another advantage of system 10 is that a backplane may be used that supports both protected interfaces and unprotected interfaces, based at least in part on the choice of I/O panel 16. This can allow a user to select an I/O panel 16 that provides unprotected interfaces in one instance, and in another instance the user can provide protected interfaces by selecting a different I/O panel 16. A common backplane may be used by the user that supports both protected and unprotected interfaces; the choice of protected vs. unprotected and/or the connector type may be made based on the I/O panel 16 chosen. A user may swap I/O panels 16 when different applications or uses are desired.

FIG. 2 illustrates one view of a backplane/shelf 40 viewed from the rear comprising MPCs 46a and 46b in this embodiment. Shelf 40 further comprises mounting brackets 42a and 42b and venting 44. Brackets 42a and 42b may be used to couple to any appropriate structure, such as rack structure 18, and venting 44 may be used to provide air flow for plug-in units or for any other component. In some embodiments, MPCs 46a and 46b are configured to receive one or more signals from one or more plug-in units 14 (not shown in FIG. 2) and couple those signals to one or more installed I/O panels 16 (also not shown in FIG. 2) or to another component. MPCs 46a and 46b may comprise a portion of a backplane in some embodiments. A backplane may contain more than two MPCs in some embodiments.

In one embodiment, MPC 46a or 46b receives a first signal and a second signal from a first plug-in unit 14, and a third signal and a fourth signal from a second plug-in unit 14. The backplane can transmit the first signal and the third signal to output (MPC) 46a, and transmit the second signal and the fourth signal to output (MPC) 46b. Each of the two plug-in units 14 transmits a signal to each of the two MPCs 46 via the backplane. MPC 46a and/or 46b can then transmit those signals to one or more I/O panels, wherein the I/O panels can provide either protected or unprotected interfaces and can also provide a choice of connector type for transmitting the signals. Both MPC 46a and 46b can service multiple signals, each protected or unprotected.

FIG. 3 illustrates one example embodiment of a portion of a backplane assembly 50 (viewed from the front) in system 10, with no plug-in units installed. Backplane assembly 50 is configured to receive signals from one or more plug-in units 14 (not shown in FIG. 3) at ports 52a and 52b. In one embodiment, a first plug-in unit 14 couples to port 52a, and a second plug-in unit 14 couples to port 52b. The plug-in units 14 are operable to transmit one or more signals through the backplane assembly 50 to one or more mid-plane connectors and/or an I/O panel in some embodiments (typically via MPC to I/O panel). Backplane assembly 50 may comprise any number or type of electrical connections to provide functionality to system 10.

Figure 4:
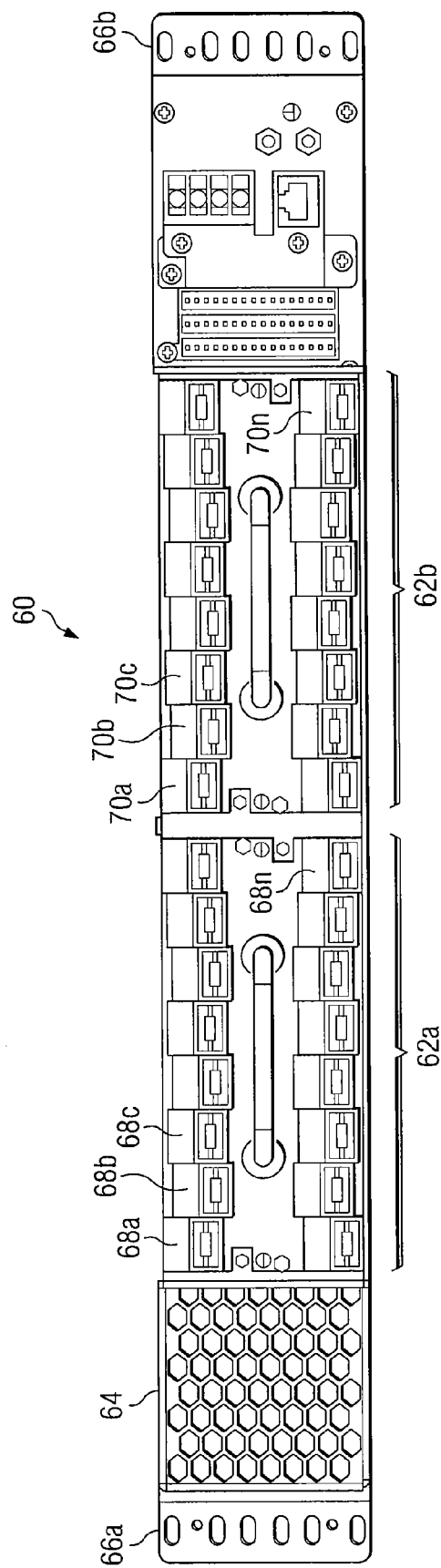
FIG. 4 illustrates one example embodiment of an I/O panel structure comprising two identical I/O panels.

FIG. 4 illustrates one example embodiment of an I/O panel structure 60 in system 10. In this example embodiment, I/O panel structure 60 comprises I/O panels 62a and 62b. Other embodiments may comprise a different number of I/O panels 62. Shelf features including mounting brackets 66a and 66b and venting 64 are also shown. These components may comprise other configurations in other embodiments, or may be absent in some embodiments.

I/O panel 62a may comprise one or more outputs 68a-68n, referred to collectively as outputs 68. Outputs 68 are illustrated as Ethernet outputs in this example. Outputs 68 could comprise 10BASE-T, 100BASE-T, or 1000BASE-T in various embodiments. In this embodiment, sixteen Ethernet outputs are shown, but any appropriate number of outputs may be placed on the I/O panel 62a. In this embodiment, outputs 68 comprise unprotected interfaces. In other embodiments, outputs 68 may comprise protected interfaces. In addition, in other embodiments outputs 68 could comprise a different type of connector, such as DS1 or DS3.

I/O panel 62b may comprise one or more outputs 70a-70n, referred to collectively as outputs 70. Outputs 70 are illustrated as Ethernet outputs in this example. Outputs 70 could comprise any type of Ethernet output, or could comprise a different type of output in other embodiments. In addition, any number of outputs 70 may be present on I/O panel 62b, and the outputs may comprise either protected or unprotected interfaces. A user of system 10 may choose to select I/O panels 62a and/or 62b to provide the type of connector the user wants to use and the type of interface the user wants, either protected or unprotected. System 10 thus provides flexibility for users in connector type, connector number, and/or protection. Users of system 10 can swap I/O panels 62 when a different functionality is wanted. Users can choose between protection type and connector type by merely exchanging I/O panels 62 in some embodiments. The backplane including the MPCs in system 10 can remain the same for these different uses. Thus, system 10 provides flexibility of protection type and connector type while allowing other components of system 10 to remain common between different setups.

Figure 5A:
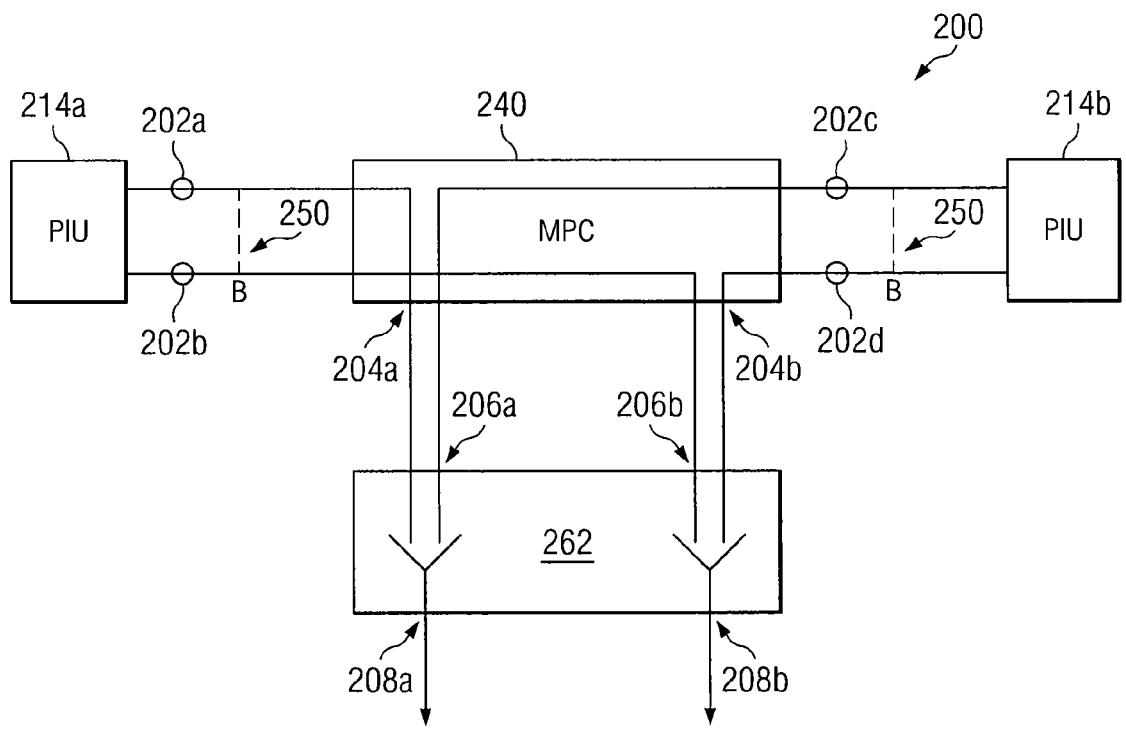
FIGS. 5A and 5B illustrate example block diagrams of systems comprising protected interfaces and unprotected interfaces.
Figure 5B:
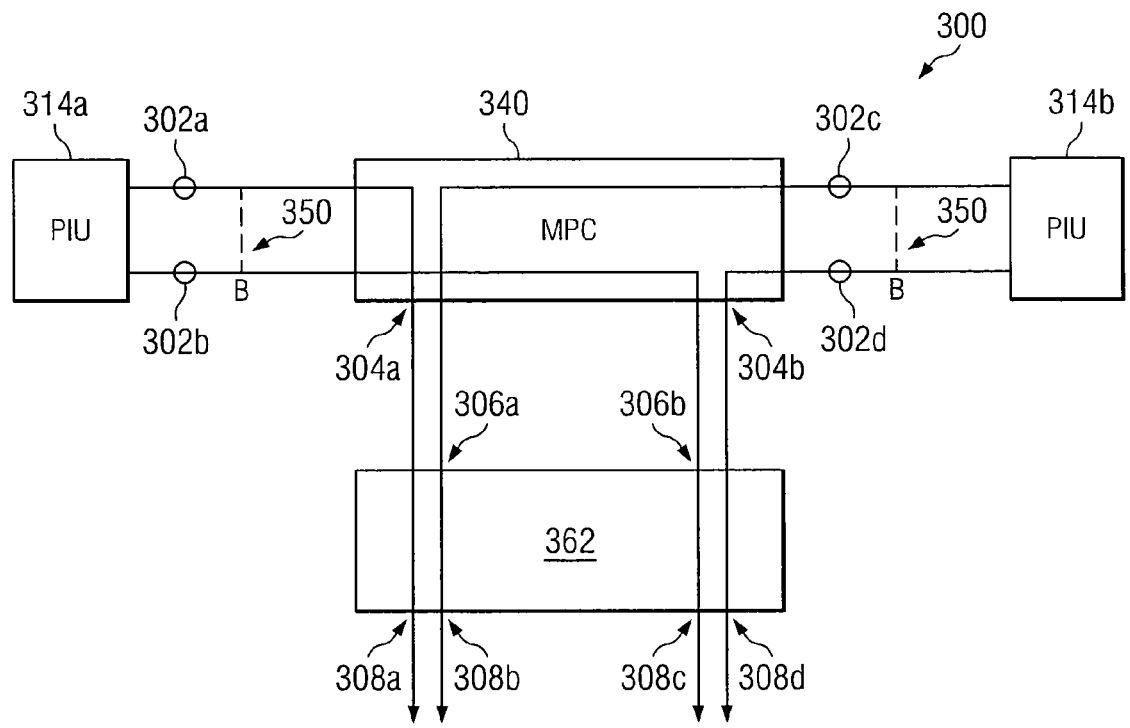

FIGS. 5A and 5B illustrate example block diagrams of a system comprising protected interfaces and unprotected interfaces, respectively. The components of FIGS. 5A and 5B may be arranged in other configurations in other embodiments. In addition, components may be removed or added to the system and still fall within the scope of this disclosure.

FIG. 5A illustrates an example system 200 that provides a protected interface via an I/O panel. System 200 comprises, in part, plug-in units 214a and 214b, backplane 250, MPC 240, and I/O panel 262. The components in FIG. 5A may be similar to components discussed above. System 200 may be configured similarly to system 10 illustrated in FIG. 1, or may have an alternate configuration in some embodiments.

In FIG. 5A, plug-in units 214a and 214b may comprise any type of unit operable to receive, transmit, and/or process one or more signals. System 200 may comprise any suitable number of plug-in units. In the illustrated examples, plug-in units 214a and 214b are configured to transmit signals 202a-202d to MPC 240 in this embodiment. In other embodiments, plug-in units 214 may transmit more or fewer signals. In this embodiment, signals 202a-202d are transmitted through backplane 250 to MPC 240. Backplane 250 is illustrated twice in FIG. 5A, although backplane 250 may comprise a single backplane common to both plug-in unit 214a and plug-in unit 214b. Backplane 250 may send and/or receive signals from other components of system 200. In other embodiments, a greater number of plug-in units 214 may be present and may share a common backplane.

In operation, plug-in unit 214a sends signals 202a and 202b to MPC 240. Plug-in unit 214b sends signals 202c and 202d to MPC 240. In this embodiment, the signals are not tied together on the backplane. Each of the signals is sent separately to MPC 240, and MPC 240 outputs the signals at outputs 204a and 204b. In this example embodiment, signals 202a and 202c are sent to output 204a of MPC 240, and signals 202b and 202d are sent to output 204b of MPC 240. Each output of MPC 240 (204a and 204b) outputs a signal from each of the plug-in units 214.

The signals are sent from MPC 240 to I/O panel 262. Input 206a of I/O panel 262 receives signals 202a and 202c, and input 206b receives signals 202b and 202d. An I/O panel 262 can be selected with a structure that provides a protected interface. In this example, I/O panel 262 ties signals 202a and 202c, and ties signals 202b and 202d. The tied signals are then output at outputs 208a and 208b. A protected interface is created for the signals. If one plug-in unit 214 fails, the other plug-in unit will still be able to provide signals to each output 208 on I/O panel 262. A user of system 200 can select one or more I/O panels 262 that provide protected interfaces if protection is desired for the system.

In addition, a user of system 200 can select one or more I/O panels 262 that comprise the type and number of connectors the user wants for the system. As one example, a user may want a protected interface comprising DS3 connections. The user can select an I/O panel 262 that comprises DS3 connections in any suitable number or arrangement. Any other type of connector may be used on I/O panel 262. Any number of I/O panels 262 may also be used in system 200.

FIG. 5B illustrates an example system 300 that provides an unprotected interface via an I/O panel. System 300 comprises, in part, plug-in units 314a and 314b, backplane 350, MPC 340, and I/O panel 362. The components in FIG. 5B may be similar to components discussed above. System 300 may be configured similarly to system 10 illustrated in FIG. 1, or may have an alternate configuration in some embodiments.

In FIG. 5B, plug-in units 314a and 314b may comprise any type of unit operable to receive, transmit, and/or process one or more signals. System 300 may comprise any suitable number of plug-in units. Plug-in units 314a and 314b are configured to transmit signals 302a-302d to MPC 340 in this embodiment. In other embodiments, plug-in units 314 may transmit more or fewer signals. In this embodiment, signals 302a-302d are transmitted through backplane 350 to MPC 340. Backplane 350 is illustrated twice in FIG. 5B, although backplane 350 may comprise a single backplane common to both plug-in unit 314a and plug-in unit 314b. Backplane 350 may send and/or receive signals from other components of system 300. In other embodiments, a greater number of plug-in units 314 may be present and may share a common backplane.

In operation, plug-in unit 314a sends signals 302a and 302b to MPC 340. Plug-in unit 314b sends signals 302c and 302d to MPC 340. In this embodiment, the signals are not tied together on the backplane. Each of the signals is sent separately to MPC 340, and MPC 340 outputs the signals at outputs 304a and 304b. In this example embodiment, signals 302a and 302c are sent to output 304a of MPC 340, and signals 302b and 302d are sent to output 304b of MPC 340. Each output of MPC 340 (304a and 304b) outputs a signal from each of the plug-in units 314.

System 300 is configured to provide an unprotected interface for the signals. The signals from plug-in units 314 are sent from MPC 340 to I/O panel 362. Input 306a of I/O panel 362 receives signals 302a and 302c, and input 306b receives signals 302b and 302d. An I/O panel 362 can be selected with a structure that provides an unprotected interface. In this example, I/O panel 362 passes each of the four illustrated signals to one or more outputs. In this embodiment, the signals are output at outputs 308a, 308b, 308c, and 308d. I/O panel 362 provides an unprotected interface. That is, if one plug-in unit 314 fails, the signals from that plug-in unit will not reach an output at the I/O panel 362. A user of system 300 can select an I/O panel 362 that provides unprotected interfaces if no protection is desired for the system. Systems with unprotected interfaces may have greater capacity than systems with protected interfaces in some embodiments.

In addition, a user of system 300 can select an I/O panel 362 that comprises the type and number of connectors the user wants for the system. As one example, a user may want an unprotected interface comprising Ethernet connections, such as 100BASE-T or 1000BASE-T. The user can select an I/O panel 362 that comprises Ethernet connections in any suitable number or arrangement. Any other type of connector may be used on I/O panel 362, instead of or in addition to Ethernet connectors. Any number of I/O panels 362 may also be used in system 300.

One advantage of the systems described in FIGS. 5A and 5B is that a common backplane and MPCs may be used that can provide both protected and unprotected interfaces, depending on the type of I/O panel selected. In addition, different types of connectors can be utilized based on the type of I/O panel. In certain embodiments, the backplane does not have to have any I/O connectors hard wired to it, allowing the space on the backplane to be used for other functionality.

Figure 6:
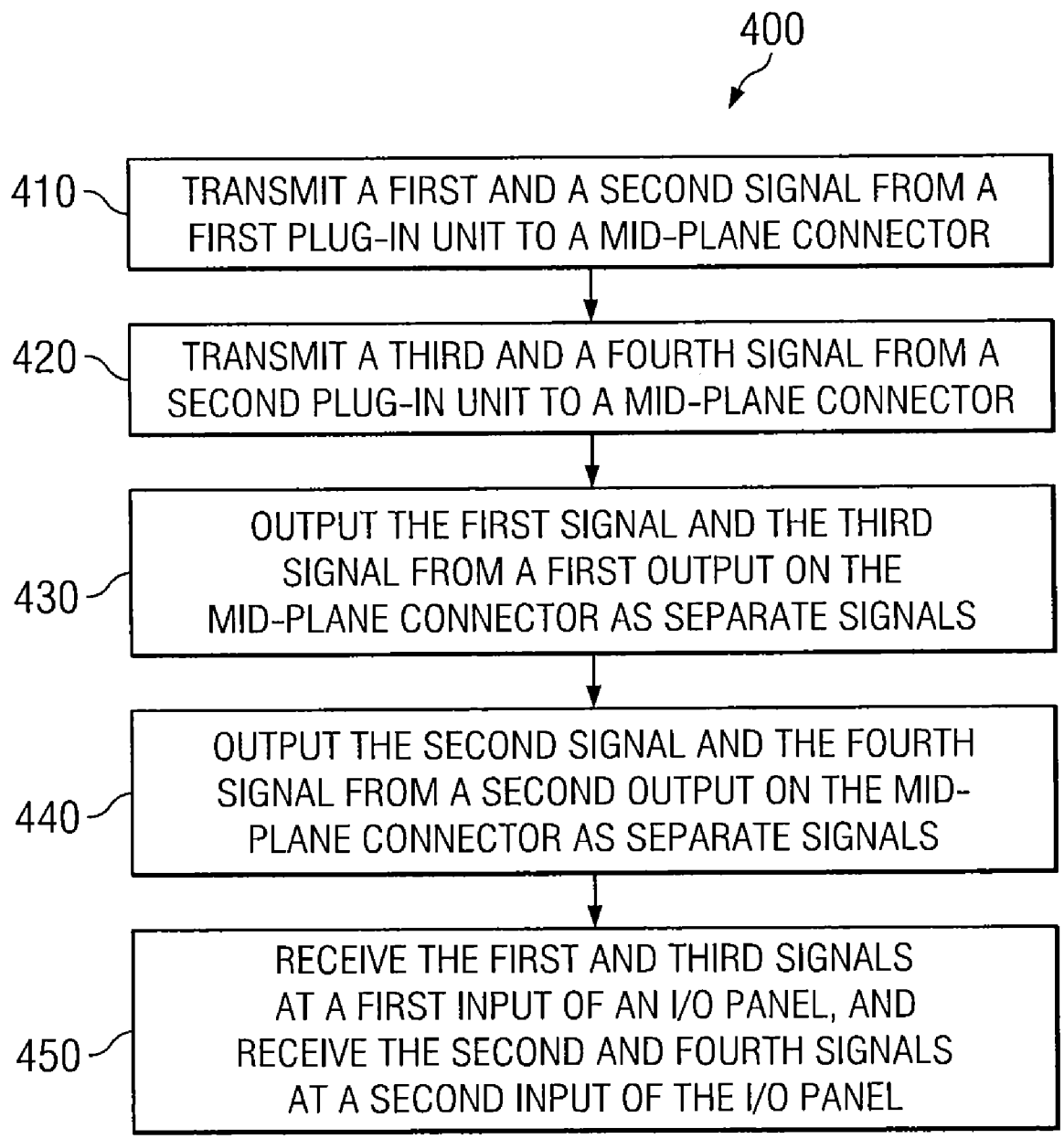
FIG. 6 illustrates an example method of providing an interface for one or more plug-in units via an I/O panel.

FIG. 6 illustrates an example method 400 of providing an interface for one or more plug-in units via an I/O panel. The steps illustrated in FIG. 6 may be combined, modified, or deleted where appropriate. Additional steps may also be added to the example operation. Furthermore, the described steps may be performed in any suitable order.

The process begins with step 410. In step 410, a first signal and a second signal are transmitted from a first plug-in unit to a mid-plane connector. The first signal and the second signal may be transmitted through a backplane. The first signal and the second signal may carry any type of data. Any suitable mechanism may be used to transmit the signals.

In step 420, a third signal and a fourth signal are transmitted from a second plug-in unit to the mid-plane connector. The third signal and the fourth signal may be transmitted through a backplane. The third signal and the fourth signal may carry any type of data. Any suitable mechanism may be used to transmit the signals. In some embodiments, the signals from the second plug-in unit transmit the same data as the signals from the first plug-in unit. This can provide protection for the system if one of the PIUs fails.

In step 430, the first signal and the third signal are output from a first output on the mid-plane connector as separate signals. In this embodiment, the signals are not tied together at the mid-plane connector. Any suitable structure or method may be used to transmit the signals at the first output of the mid-plane connector.

In step 440, the third signal and the fourth signal are output from a second output on the mid-plane connector as separate signals. In this embodiment, the signals are not tied together at the mid-plane connector. Any suitable structure or method may be used to transmit the signals at the second output of the mid-plane connector. The mid-plane connector may also comprise other outputs in other embodiments, and may transmit other signals from one or more plug-in units in other embodiments.

In step 450, the first and third signals are received at a first input of an I/O panel. In addition, the second and fourth signals are received at a second input of an I/O panel. One or more different I/O panels may be selected to receive the signals. The I/O panels may create a protected interface for one or more of the signals in some embodiments, and may create an unprotected interface for one or more of the signals in other embodiments. The I/O panel may also comprise one or more connectors for outputting the signals. The connectors may comprise connectors of any suitable type, such as DS1, DS3, Ethernet, or any other type of connector.

Although the present disclosure has been described with several embodiments, a myriad of changes, variations, alterations, transformations, and modifications may be suggested to one skilled in the art, and it is intended that the present disclosure encompass such changes, variations, alterations, transformations, and modifications as fall within the scope of the appended claims.

What is claimed is:

1. A system, comprising:
a backplane configured to receive a first signal and a second signal from a first plug-in unit, and a third signal and a fourth signal from a second plug-in unit, wherein the backplane is further configured to communicate each of the signals to one or more mid-plane connectors;
the one or more mid-plane connectors configured to output the first and third signals at a first output as separate signals, and configured to output the second and fourth signals at a second output as separate signals; and
one or more I/O panels each configured to receive the first and third signals at a first input and to receive the second and fourth signals at a second input.

2. The system of claim 1, wherein an I/O panel outputs one of the signals from each input to provide a protected interface.

3. The system of claim 1, wherein an I/O panel outputs each of the first, second, third, and fourth signals separately for an unprotected interface.

4. The system of claim 1, wherein an I/O panel comprises one or more DS3 outputs.

5. The system of claim 1, wherein the I/O panel comprises one or more DS1 outputs.

6. The system of claim 1, wherein an I/O panel comprises one or more Ethernet outputs.

7. The system of claim 1, wherein the signals comprise optical signals.

8. The system of claim 1, wherein the signals are not tied together on the backplane.

9. A method, comprising:
transmitting a first signal and a second signal from a first plug-in unit through a backplane to one or more mid-plane connectors, and transmitting a third signal and a fourth signal from a second plug-in unit through the backplane to one or more mid-plane connectors, wherein the signals are not tied together at the backplane;
outputting the first signal and the third signal from a first mid-plane connector as separate signals, and outputting the second signal and the fourth signal from a second mid-plane connector as separate signals; and
receiving the first and third signals at a first input of an I/O panel, and receiving the second and fourth signals at a second input of the I/O panel.

10. The method of claim 9, wherein the I/O panel outputs one of the signals from each input to create a protected interface for each of the plug-in units.

11. The method of claim 9, wherein the I/O panel outputs each of the received signals separately to create an unprotected interface for the signals.

12. The method of claim 10, wherein the protected interface comprises a DS3 connection.

13. The method of claim 11, wherein the unprotected interface comprises an Ethernet connection.

14. The method of claim 10, wherein the protected interface comprises a DS1 connection.

* * * * *